(12) United States Patent
Cyrusian

(10) Patent No.: US 7,576,667 B1
(45) Date of Patent: Aug. 18, 2009

(54) HIERARCHIED CALIBRATION CIRCUIT

(75) Inventor: Sasan Cyrusian, Scotts Valley, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/835,952

(22) Filed: Aug. 8, 2007

Related U.S. Application Data

(60) Provisional application No. 60/922,816, filed on Apr. 10, 2007.

(51) Int. Cl.
  *H03M 1/10* (2006.01)
(52) U.S. Cl. ................................. 341/120; 341/144
(58) Field of Classification Search .......... 341/120–144
  See application file for complete search history.

(56) References Cited

U.S. PATENT DOCUMENTS

| | | | |
|---|---|---|---|
| 4,967,140 A | | 10/1990 | Groeneveld et al. |
| 5,021,784 A | | 6/1991 | Groeneveld et al. |
| 6,058,291 A | * | 5/2000 | Ketcham ................... 455/46 |
| 6,664,909 B1 | * | 12/2003 | Hyde et al. ................ 341/144 |
| 6,891,488 B1 | * | 5/2005 | McDaniel et al. .......... 341/143 |
| 6,909,389 B1 | * | 6/2005 | Hyde et al. ................ 341/144 |
| 7,113,119 B2 | * | 9/2006 | Van Veldhoven et al. .... 341/143 |

OTHER PUBLICATIONS

A Self-Calibration Technique for Monolithic High-Resolution D/A Converters, D. Wouter J. Groeneveld et al., IEEE Journal of Solid-State Circuits, vol. 24, No. 6, Dec. 1989, pp. 1517-1522.

* cited by examiner

*Primary Examiner*—Lam T Mai

(57) ABSTRACT

A digital-to-analog converter is described. The digital-to-analog converter converts an m-bit digital signal into an analog signal using m weighted currents, such as m binary-weighted currents. A first weighted current may be calibrated using a reference current. The first weighted current may be compared to the reference current, and a control signal, controlling the first weighted current, may be generated to adjust the first weighted current to be substantially equal to the reference current. The first weighted current may then be compared with another of the m weighted currents (such as a second weighted current). The comparison may be used to further calibrate the first weighted current or to calibrate the second weighted current.

41 Claims, 14 Drawing Sheets

US 7,576,667 B1

HIERARCHIED CALIBRATION CIRCUIT

CROSS-REFERENCE TO RELATED APPLICATION

This application claims the benefit of U.S. Provisional Application No. 60/922,816, filed Apr. 10, 2007, the entirety of which is hereby incorporated by reference.

BACKGROUND

A digital-to-analog converter (DAC) converts a digital code to an analog signal. Digital-to-analog converters may be used as the interface between the digital world (such as the world of computers) and the analog world. For example, one type of digital code input to a DAC may be a binary digital signal commonly used in computers or other electronics. With a binary digital signal, the digital-to-analog converter may be a binary weighted digital-to-analog converter in which the binary digital signal is translated into the analog signal. The analog signal output from the DAC may take a variety of forms, such as a current, a voltage, or an electric charge.

The circuitry of the DAC may be implemented in several ways, such as by using switches, a network of resistors, capacitors, or current sources. When using current sources for a binary weighted DAC, the currents are generated corresponding to the binary digital input and then summed to produce an analog output.

One characteristic of the digital-to-analog converter is its resolution. The resolution is the number of possible analog output levels the digital-to-analog converter is designed to reproduce. This is usually stated as the number of bits the digital-to-analog converter uses, which for a binary weighted digital-to-analog converter is the base two logarithm of the number of levels. For instance, a 1-bit digital-to-analog converter is designed to reproduce 2 ($2^1$) levels while an 8-bit digital-to-analog converter is designed for 256 ($2^8$) levels.

To obtain the necessary resolution, prior current source based digital-to-analog converters included a number of current sources that was one less than the resolution of the digital-to-analog converter. For example, a 1-bit digital-to-analog converter included 1 current source to reproduce 2 analog output levels (the first analog output level with the current source on and the second analog output level with the current source off). A 4-bit digital-to-analog converter included 15 current sources to reproduce 16 analog output levels (e.g., the least significant bit including 1 current source, the second least significant including 2 current sources, the third least significant bit including 4 current sources, and the fourth least significant bit (i.e., most significant bit) including 8 current sources). And, an 8-bit digital-to-analog converter included 255 current sources (i.e., $2^8-1$).

Prior current source based digital-to-analog converters were calibrated using a single reference current source. Specifically, the single reference current source was individually compared to each of the current sources in the digital-to-analog converter to adjust each of the current sources to be equal to the reference current source. The prior current source based digital-to-analog converters are one of the fastest conversion methods to generate an analog signal. However, the current source based digital-to-analog converters are typically expensive and very difficult to have resolution greater than 8 bits. This is due to the number of current sources required for current source based digital-to-analog converters. As discussed above, an 8-bit digital-to-analog converter includes 255 current sources and requires comparison of each of the 255 current sources with the reference current source. Accordingly, a need exists for a current source based digital-to-analog converter that is simple in design and operation.

SUMMARY

The present invention is defined by the attached claims, and nothing in this section should be taken as a limitation on those claims. According to one aspect, a digital-to-analog converter is provided. The digital-to-analog converter converts an m-bit digital signal into an analog signal using m weighted currents, such as m binary-weighted currents. One, some, or all of the m weighted currents may first be calibrated using a reference current. For example, a first weighted current may be calibrated using the reference current. The first weighted current may be compared to the reference current, and a control signal, controlling the first weighted current, may be generated to adjust the first weighted current to be substantially equal to the reference current. The first weighted current may then be compared with another of the m weighted currents (such as a second weighted current). The comparison may be used to further calibrate the first weighted current or to calibrate the second weighted current.

In the example of binary weighted currents, the first weighted current may be calibrated to be approximately half the value of the second weighted current (e.g., the first weighted current corresponds to bit $2^N$ and the second weighted current corresponds to bit $2^{N+1}$). The first weighted current may be summed with the reference current, and the sum may be compared to the second weighted current. Either the sum (both the first weighted current and the reference current) or the second weighted current may be modified so that they are substantially equal. In this manner, the first and second weighted currents in the digital-to-analog converter may be calibrated.

Other weighted currents (in addition to the first and second weighted currents) may be calibrated using one or more reference currents. For example, the other weighted currents in the digital-to-analog converter may be calibrated using multiple reference currents. In particular, an m-bit digital-to-analog converter may include m−1 reference currents, with each of the weighted currents for each digital-to-analog converter, except for the most significant bit, having a reference current associated with it. Starting with the weighted current associated with second most significant bit, the reference current may be used to calibrate the weighted current associated with the second most significant bit. After which, the sum of the reference current and the weighted current associated with the second most significant bit is compared to the weighted current associated with the most significant bit. This sequence may be repeated by calibrating the weighted current associated with the third most significant bit, including comparing the sum of the associated reference current and the weighted current associated with the third most significant bit with the weighted current associated with the second most significant bit. The sequence may iterate through successively calibrated lesser significant bits, until the least significant bit is calibrated.

As another example, all of the weighted currents in the digital-to-analog converter may be calibrated using a single reference current. In the m-bit digital-to-analog converter example, the single reference current may be associated with the weighted current associated with the least significant bit. The weighted current associated with the least significant bit may be calibrated by comparing it with the single reference current. Then, the sum of the reference current and the weighted current associated with the least significant bit may be used to calibrate the next least significant bit. This process may be iterated until the most significant bit is calibrated. For example, the sum of the reference current and the currents associated with the least significant bit and the second least significant bit may be used to calibrate the current associated with the third least significant bit. In this way, all of the weighted currents in the digital-to-analog converter may be calibrated using only a single reference current.

The following description will now be described with reference to the attached drawings.

DETAILED DESCRIPTION

Figure 1:
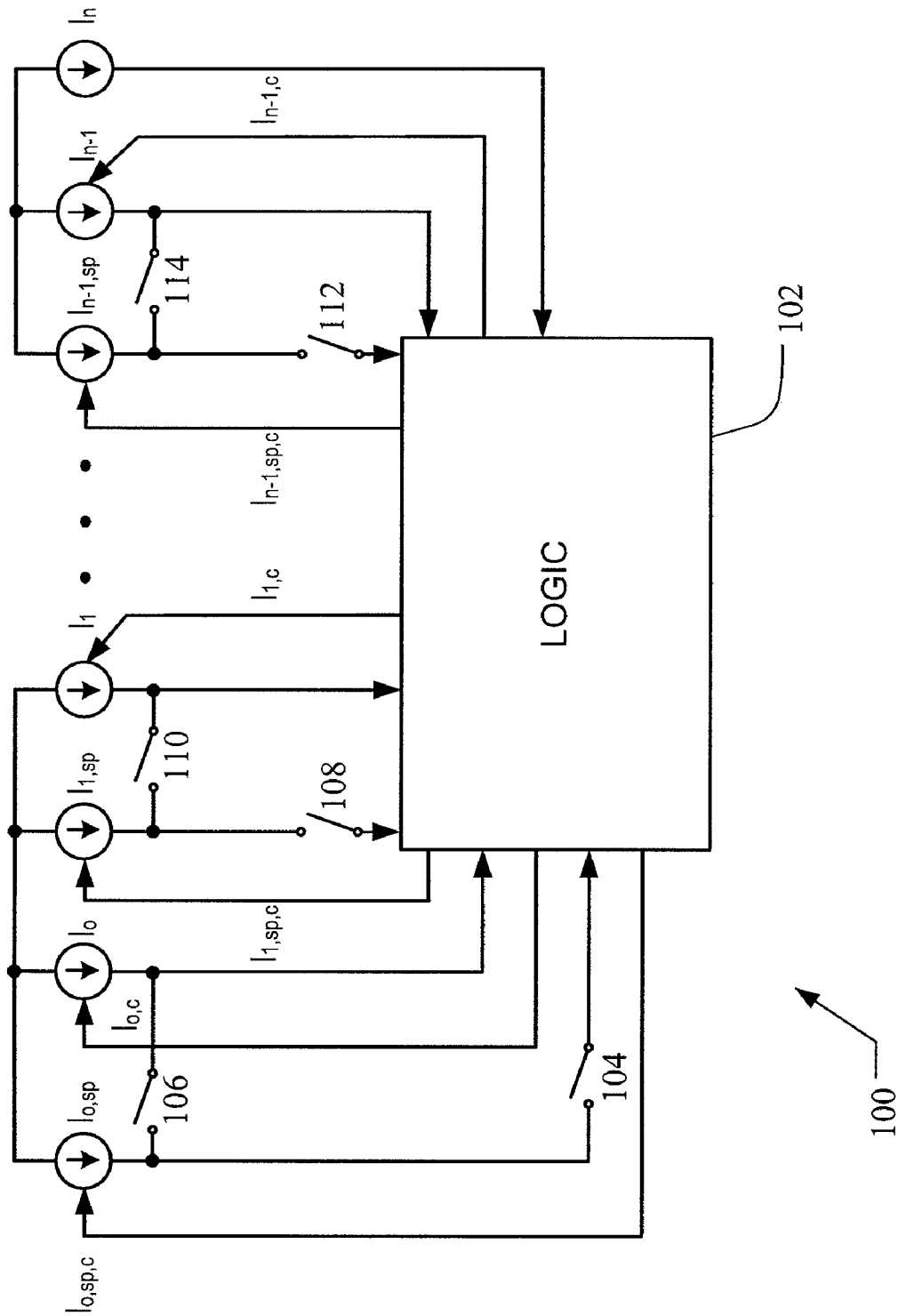
FIG. 1 is a schematic of one example of a digital-to-analog converter.

FIG. 1 shows an example of a digital-to-analog converter 100. The digital-to-analog converter 100 includes a plurality of weighted current sources, depicted as $I_0, I_1, \ldots I_{n-1}$, and $I_n$. Though FIG. 1 depicts each of the weighted current sources $I_0, I_1, \ldots I_{n-1}$, and $I_n$ as a single current source, multiple current sources may be used to generate one of the weighted current sources $I_0, I_1, \ldots I_{n-1}$, and $I_n$. For example, $I_0$ may be generated using multiple current sources in parallel, the sum of which is the weighted current for $I_0$. Various weights may be assigned to the current sources. For example, a digital-to-analog converter 100 may convert a binary input into an analog output so that the relative weights assigned to the current sources are $2^0$ for $I_0$, $2^1$ for $I_1$, $\ldots 2^{n-1}$ for $I_{n-1}$, and $2^n$ for $I_n$. One, some, or all of the plurality of weighted current sources $I_0, I_1, \ldots I_{n-1}$, and $I_n$ may have as an input control signals. As shown in FIG. 1, the weighted current sources $I_0, I_1, \ldots I_{n-1}$ have as input control signals $I_{0,C}, I_{1,C}, \ldots$ and $I_{n-1,C}$. As discussed in more detail below, the input control signals $I_{0,C}, I_{1,C}, \ldots$ and $I_{n-1,C}$ may be used to calibrate the weighted current sources $I_0, I_1, \ldots I_{n-1}$.

The digital-to-analog converter 100 may also include one or more reference current sources. One or some of the plurality of weighted currents $I_0, I_1, \ldots I_{n-1}$, and $I_n$ may have associated with it a reference current source. As shown in FIG. 1, the digital-to-analog converter 100 includes reference current sources $I_{0,SP}, I_{1,SP}, \ldots$ and $I_{n-1,SP}$ associated with weighted currents $I_0, I_1, \ldots I_{n-1}$. Again, similar to the weighted current sources $I_0, I_1, \ldots I_{n-1}$, and $I_n$, the reference current sources $I_{0,SP}, I_{1,SP}, \ldots$ and $I_{n-1,SP}$ are each depicted as a single current source; however, multiple current sources may be used to generate one of the reference current sources $I_{0,SP}, I_{1,SP}, \ldots$ and $I_{n-1,SP}$. One, some, or all of the reference current sources $I_{0,SP}, I_{1,SP}, \ldots$ and $I_{n-1,SP}$ may have as input control signals $I_{0,SP,C}, I_{1,SP,C}, \ldots$ and $I_{n-1,SP,C}$. As discussed in more detail below, the input control signals $I_{0,SP,C}, I_{1,SP,C}, \ldots$ and $I_{n-1,SP,C}$ may be used to calibrate the reference current sources $I_{0,SP}, I_{1,SP}, \ldots$ and $I_{n-1,SP}$.

The digital-to-analog converter 100 may further include logic 102 for calibrating one, some, or all of the weighted current sources $I_0, I_1, \ldots I_{n-1}$, and $I_n$ and the reference current sources $I_{0,SP}, I_{1,SP}, \ldots$ and $I_{n-1,SP}$. The logic 102 may generate control signals $I_{0,C}, I_{1,C}, \ldots, I_{n-1,C}, I_{0,SP,C}, I_{1,SP,C}, \ldots$ and $I_{n-1,SP,C}$ to calibrate the weighted current sources $I_0, I_1, \ldots I_{n-1}$ and the reference current sources $I_{0,SP}, I_{1,SP}, \ldots$ and $I_{n-1,SP}$. The logic 102 may receive as input the current from one, some, or all of the weighted current sources $I_0, I_1, \ldots I_{n-1}$, and $I_n$ and the reference current sources $I_{0,SP}, I_{1,SP}, \ldots$ and $I_{n-1,SP}$. As shown in FIG. 1, the logic 102 receives input from all of the weighted current sources $I_0, I_1 \ldots I_{n-1}$, and $I_n$ and all of the reference current sources $I_{0,SP}, I_{1,SP}, \ldots$ and $I_{n-1,SP}$.

In addition, the digital-to-analog converter 100 may include switches 104, 106, 108, 110, 112, and 114. For example, the switches 104, 108, and 112 may be used to input the reference current sources $I_{0,SP}, I_{1,SP}, \ldots$ and $I_{n-1,SP}$ into the logic 102. The switches 106, 110, and 114 may be used to combine the weighted current sources $I_0, I_1, \ldots I_{n-1}$, and $I_n$ with its associated reference current sources $I_{0,SP}, I_{1,SP}, \ldots$ and $I_{n-1,SP}$. As discussed in more detail below, the combinations of currents may be used by the logic 102 to calibrate the digital-to-analog converter 100.

Figure 2:
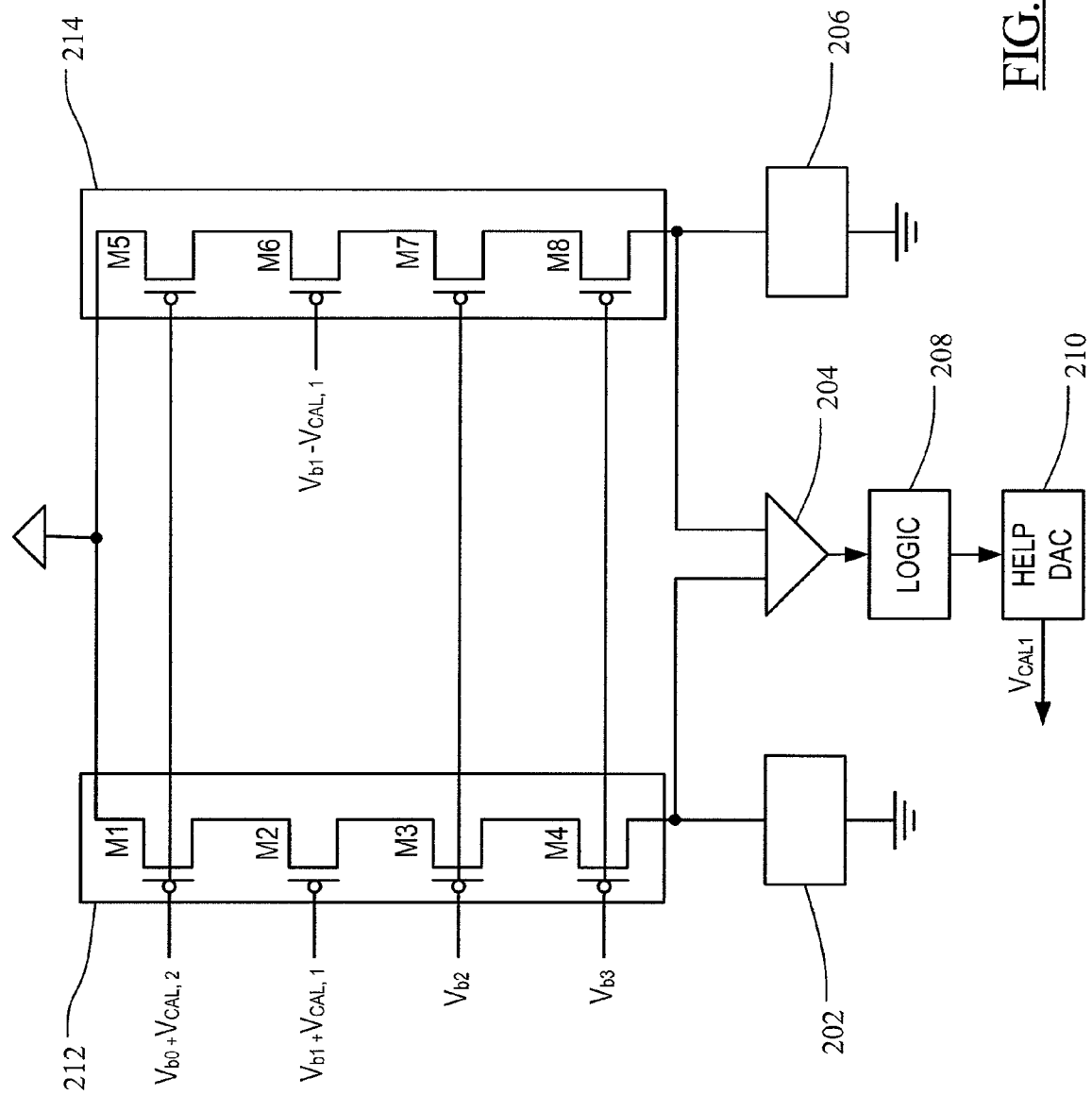
FIG. 2 is a circuit diagram of a reference current source, a first weighted current source, and circuitry for calibrating the first weighted current source for the digital-to-analog converter shown in FIG. 1.

FIG. 2 is a circuit diagram of a reference current source 212, a first weighted current source 214, and circuitry for calibrating the first weighted current source for the digital-to-analog converter shown in FIG. 1. The reference current source 212 includes transistors M1, M2, M3, and M4. The first weighted current source 214 includes transistors M5, M6, M7, and M8. Transistors M1 and M2 in reference current source 212 and transistors M5 and M6 in the first weighted current source 214 are for calibration. As discussed in more detail below, transistors M2 and M6 are for a first calibration step, making the currents in the reference current source 212 and the first weighted current source 214 substantially equal. Transistors M1 and M5 are for a second calibration step, making the sum of the currents in the reference current source 212 and the first weighted current source 214 substantially equal to another weighted current source. Though two transistors (M1 and M2, M5 and M6) are used in the reference current source 212 and the first weighted current source 214, the two calibration steps may be accomplished using a single transistor in each of the reference current source 212 and the first weighted current source 214. Transistors M3 and M7 act as the current source in each of the reference current source 212 and the first weighted current source 214. Transistors M3 and M7 may operate in the linear region or in the saturation region. Transistors M4 and M8 act as cascode devices in order to improve the output impedance of the reference current source 212 and the first weighted current source 214; however, transistors M4 and M8 need not be included in the reference current source 212 and the first weighted current source 214.

FIG. 2 also includes comparator 204, logic 208, and HELP DAC 210. Comparator 204 may compare the currents in the reference current source 212 and the first weighted current source 214, outputting a first value if the current in the reference current source 212 is greater than the first weighted current source 214 and outputting a second value if the current in the reference current source 212 is less than the first weighted current source 214. Logic 208 may comprise an up/down counter. Logic 208 receives the output of the comparator, counts up or down the times in which the comparator has the first value or the second value and outputs the counted value. The multi-bit value from logic 208 is sent to a HELP DAC (digital-to-analog converter) 210, which outputs an analog voltage $V_{CAL,1}$. Depending on the counted value, the HELP DAC 210 will change the value of $V_{CAL,1}$ in order to make the currents in the reference current source 212 and the first weighted current source 214 substantially equal. Specifically, because the gate voltage input to M2 and the gate voltage input to M6 use opposite signs for $V_{CAL,1}$ (i.e., the gate voltage input to M2 is $V_{b1}+V_{CAL,1}$ and the gate voltage input to M6 is $V_{b1}-V_{CAL,1}$), $V_{CAL,1}$ may be used to adjust the values of the currents in the reference current source 212 and the first weighted current source 214 in order to make them substantially equal. Other circuitry may be used to determine the difference in the currents in the reference current source 212 and the first weighted current source 214 and to generate a control signal (such as $V_{CAL,1}$) in order to adjust one or both of the current values in the reference current source 212 and the first weighted current source 214 in order to make them substantially equal.

Figure 4:
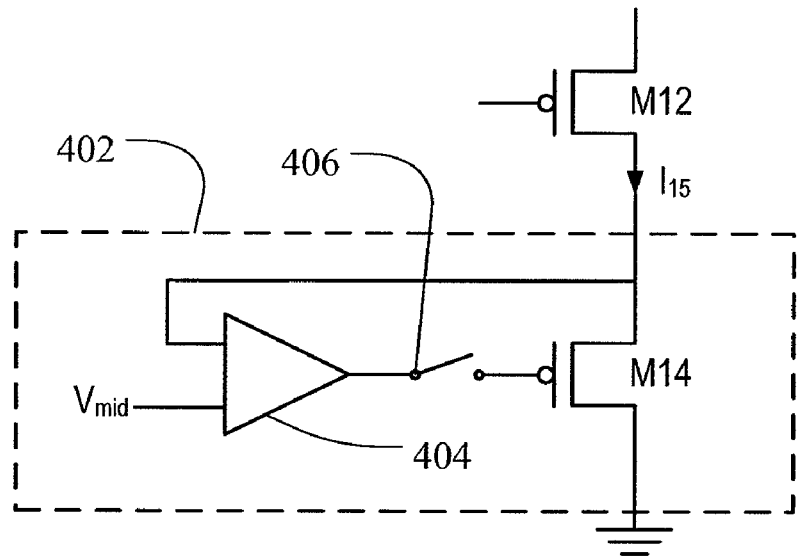
FIG. 4 is one example of a circuit diagram for replacing the resistors depicted in FIGS. 2-3.
Figure 5:
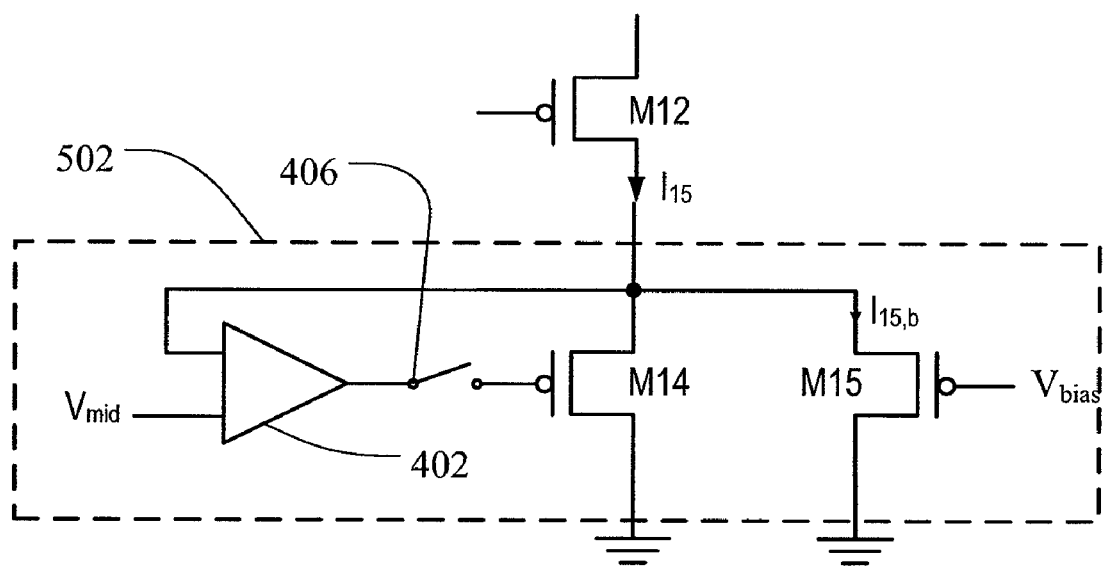
FIG. 5 is another example of a circuit diagram for replacing the resistors depicted in FIGS. 2-3.

FIG. 2 may also include two resistors 202, 206 that are substantially equal in resistance value. As discussed in more detail below, resistors 202, 206 may be replaced with different circuit elements, as shown in FIGS. 4 and 5.

Figure 3:
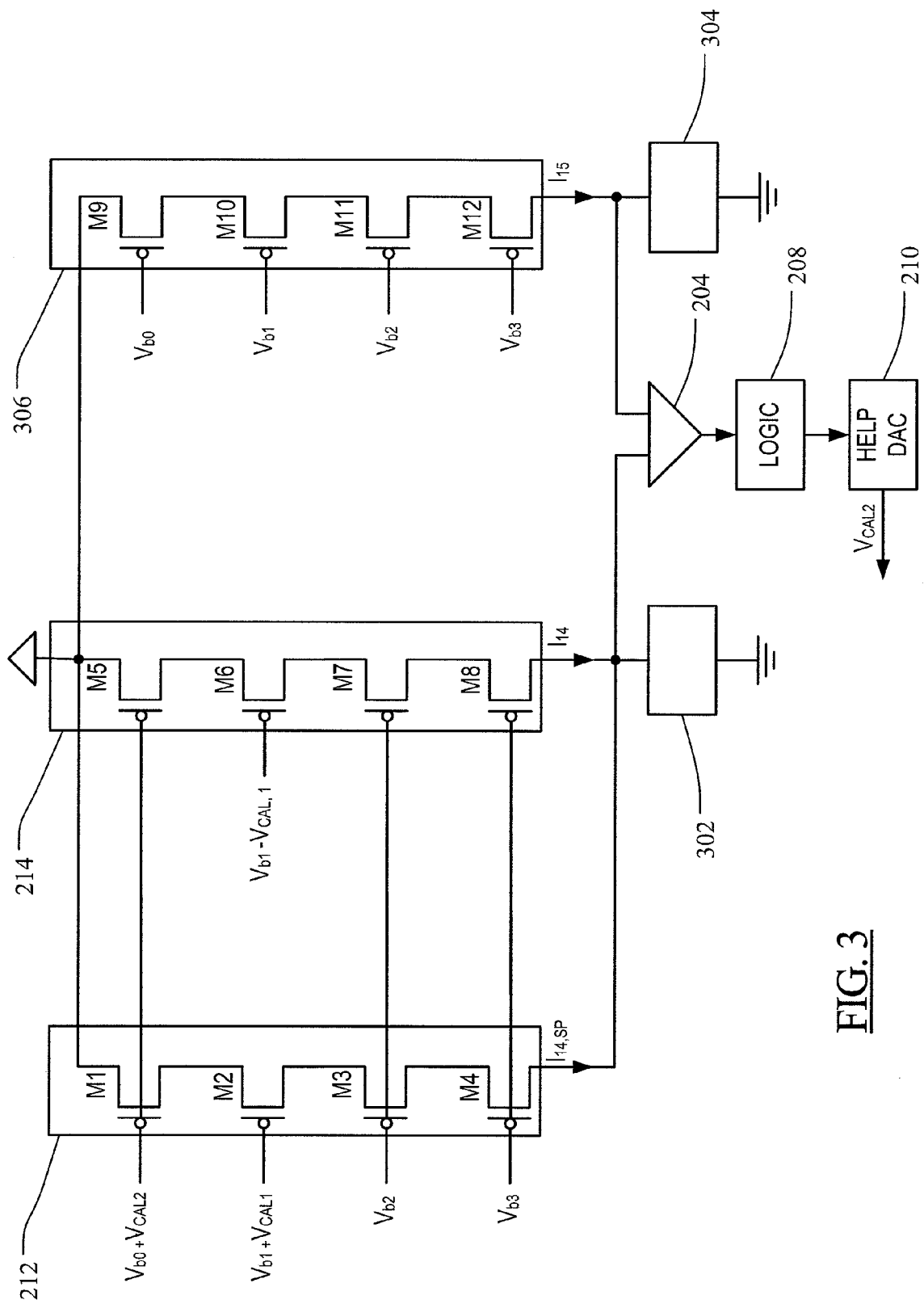
FIG. 3 is a circuit diagram of the reference current source and the first weighted current source shown in FIG. 2, a second weighted current source, and circuitry for calibrating the first weighted current source.

FIG. 3 is a circuit diagram of the reference current source 212 and the first weighted current source 214 shown in FIG. 2, a second weighted current source 306, and circuitry for calibrating the first weighted current source. The second weighted current source 306 includes transistors M9, M10, M11, and M12. FIG. 3 illustrates that the current through the reference current source 212 is $I_{14,SP}$, the current through the first weighted current source 214 is $I_{14}$, and the current through the second weighted current source 306 is $I_{15}$. The circuitry depicted in FIG. 3 may be for a 16-bit digital-to-analog converter (bits 0 to 15) so that the current $I_{15}$ is for the most significant bit. FIG. 3 is merely for illustration purposes. Digital-to-analog converters with greater or fewer numbers of input bits may be used.

As discussed in more detail below, during the second calibration step, the sum of the currents from the reference current source 212 and the first weighted current source 214 are adjusted by modifying the gate voltage to M1 and M5 using $V_{CAL,2}$. Therefore, the input voltage to transistor M9 does not need to be adjusted. Alternatively, rather than adjusting the sum of the currents from the reference current source 212 and the first weighted current source 214, the current from the second weighted current source 306 may be adjusted.

FIG. 3 also includes comparator 204, logic 208, and HELP DAC 210. The comparator 204, logic 208, and HELP DAC 210 used in FIG. 2 to equalize the current in the reference current source 212 with the current in the first weighted current source 214 may similarly be used to equalize the sum of the currents from the reference current source 212 and the first weighted current source 214 with the current in the second weighted current source 306. Alternatively, other circuitry may be used to equalize the sum of the currents from the reference current source 212 and the first weighted current source 214 with the current in the second weighted current source 306.

Similar to the description of the comparator 204 in FIG. 2, the comparator 204 may compare the sum of the currents in the reference current source 212 and the first weighted current source 214 with the current in the second weighted current source 306. Alternatively, the comparator depicted in FIG. 3 may be a separate device from comparator 204. The comparator 204 outputs a first value if the sum of the currents in the reference current source 212 and the first weighted current source 214 is greater than the current in the second weighted current source 306 and outputs a second value if the sum of the currents in the reference current source 212 and the first weighted current source 214 is less than the current in the second weighted current source 306. Logic 208 may count up or down the times in which the comparator has the first value or the second value and outputs the counted value. The multi-bit value from logic 208 is sent to a HELP DAC 210, which outputs an analog voltage $V_{CAL,2}$. Depending on the counted value, the HELP DAC 210 will change the value of $V_{CAL,2}$ in order to make the sum of the currents in the reference current source 212 and the first weighted current source 214 be substantially equal to the current in the second weighted current source 306. Specifically, because the gate voltage input to M1 and the gate voltage input to M5 use the same sign for $V_{CAL,2}$ (i.e., the gate voltage input to M1 is $V_{b0}+V_{CAL,2}$ and the gate voltage input to M5 is $V_{b1}+V_{CAL,2}$), $V_{CAL,2}$ may be used to adjust the values of the currents in the reference current source 212 and the first weighted current source 214 so that the sum is substantially equal to the current in the second weighted current source 306. Other circuitry may be used to determine the difference between the sum of the currents in the reference current source 212 and the first weighted current source 214 and the current in the second weighted current source 306, and to generate a control signal (such as $V_{CAL,2}$) in order to adjust the sum of the currents in the reference current source 212 and the first weighted current source 214, and/or the current in the second weighted current source 306 in order to make them substantially equal. For example, a linear amplifier may be used, such as that depicted in FIG. 6.

FIG. 3 also shows two resistors 302, 304 that are substantially equal in resistance value. As discussed in more detail below, resistors 302, 304 may be replaced with different circuit elements, as shown in FIGS. 4 and 5.

FIG. 4 is one example of a circuit diagram for replacing the resistors 202, 206 depicted in FIG. 2 and resistors 302, 304 depicted in FIG. 3. The circuit 402 depicted in FIG. 4 may be used to generate a copy of the current input to the circuit with an opposite sign. For example, the circuit 402 may generate a copy of the input current $I_{15}$ with the opposite sign. The circuit 402 includes an amplifier 404, a switch 406, and a transistor M14. One input to the amplifier may be $V_{mid}$, which is a voltage approximately between power and ground. The switch 406 may be opened and closed in order to sample the output of amplifier 404 to the gate of transistor M14.

FIG. 5 is another example of a circuit diagram for replacing the resistors 202, 206 depicted in FIG. 2 and resistors 302, 304 depicted in FIG. 3. The circuit 502 depicted in FIG. 5 is similar to the circuit 402 shown in FIG. 4, with the addition of transistor M15. The transistor M15 carries more of the current than the transistor M14. For example, using $V_{bias}$ as the gate voltage input to M15, $I_{15,b}$ depicted in FIG. 5 may be between 95% and 98% of 115. In this way, transistor M14, which is subject to calibration, contributes a fraction of the current, thereby reducing the contribution of sampling error, amplifier error, and leakage at the sampling capacitor.

Figure 6:
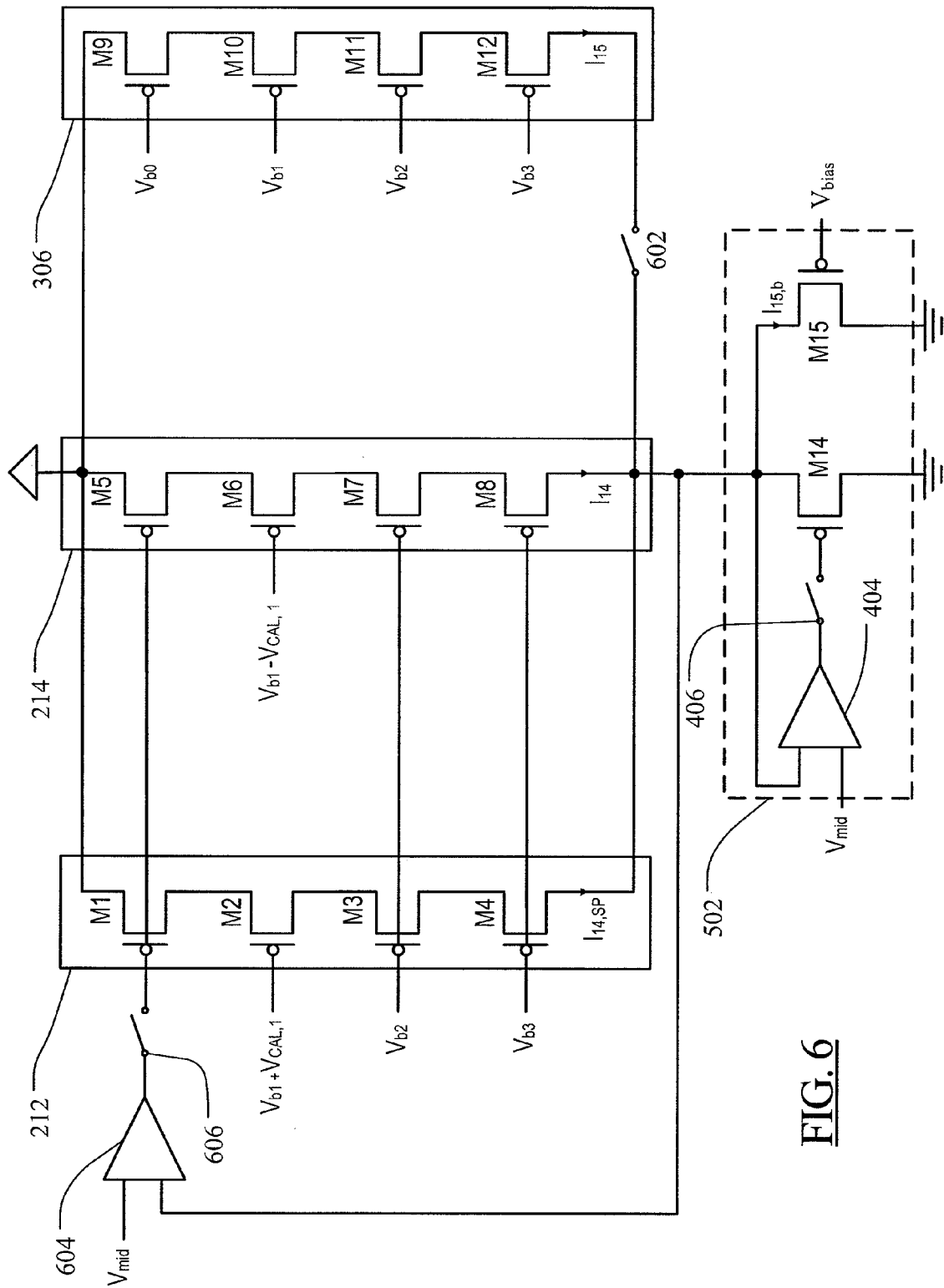
FIG. 6 is a circuit diagram of the reference current source and the first weighted current source, a second weighted current source, and another example of calibration circuitry.

FIG. 6 is a circuit diagram of the reference current source 212, the first weighted current source 214, a second weighted current source 306, and another example of calibration circuitry. The calibration circuitry includes the circuit 502 described in FIG. 5, and it includes an error amplifier 604 and sampling switch 606. The error amplifier 604 has as one of its inputs $V_{mid}$ and another input common to the input of circuit 502. The error amplifier 604 may detect the difference between the inputs and force the gate voltages of M1 and M5 to $V_{mid}$.

As described above, the calibration of any of the current sources, such as the reference current source 212, the first weighted current source 214, and the current in the second weighted current source 306, may be accomplished in several ways. One way, as disclosed in FIGS. 2 and 3, is to incorporate the calibration circuitry with the current sources in a serial approach, such as by putting calibration circuitry in series with the current generated from the current sources. Another way, as disclosed in FIGS. 5 and 6, is to calibrate the current sources in a parallel approach, such as by putting calibration circuitry in parallel with the current generated from the current sources (e.g., modifying the gate voltage input to transistor M14).

The digital-to-analog converter may include for one, some, or all of its current sources, the calibration circuitry depicted in FIGS. 2-6. For example, all of the current sources in the digital-to-analog converter may be calibrated using the calibration circuitry. As another example, less than all of the current sources in the digital-to-analog converter may be calibrated using the calibration circuitry depicted in FIGS. 2-6. Specifically, some of the multiple current sources in the digital-to-analog converter, such as current sources 212, 214, and 306, may include the calibration circuitry. Other current sources may use different types of calibration, such as calibration from unit current sources. For example, if 3 bits (such as the 3 most significant bits) from the digital-to-analog converter were generated using unit current sources, 7 unit current sources may be used.

Figure 7A:
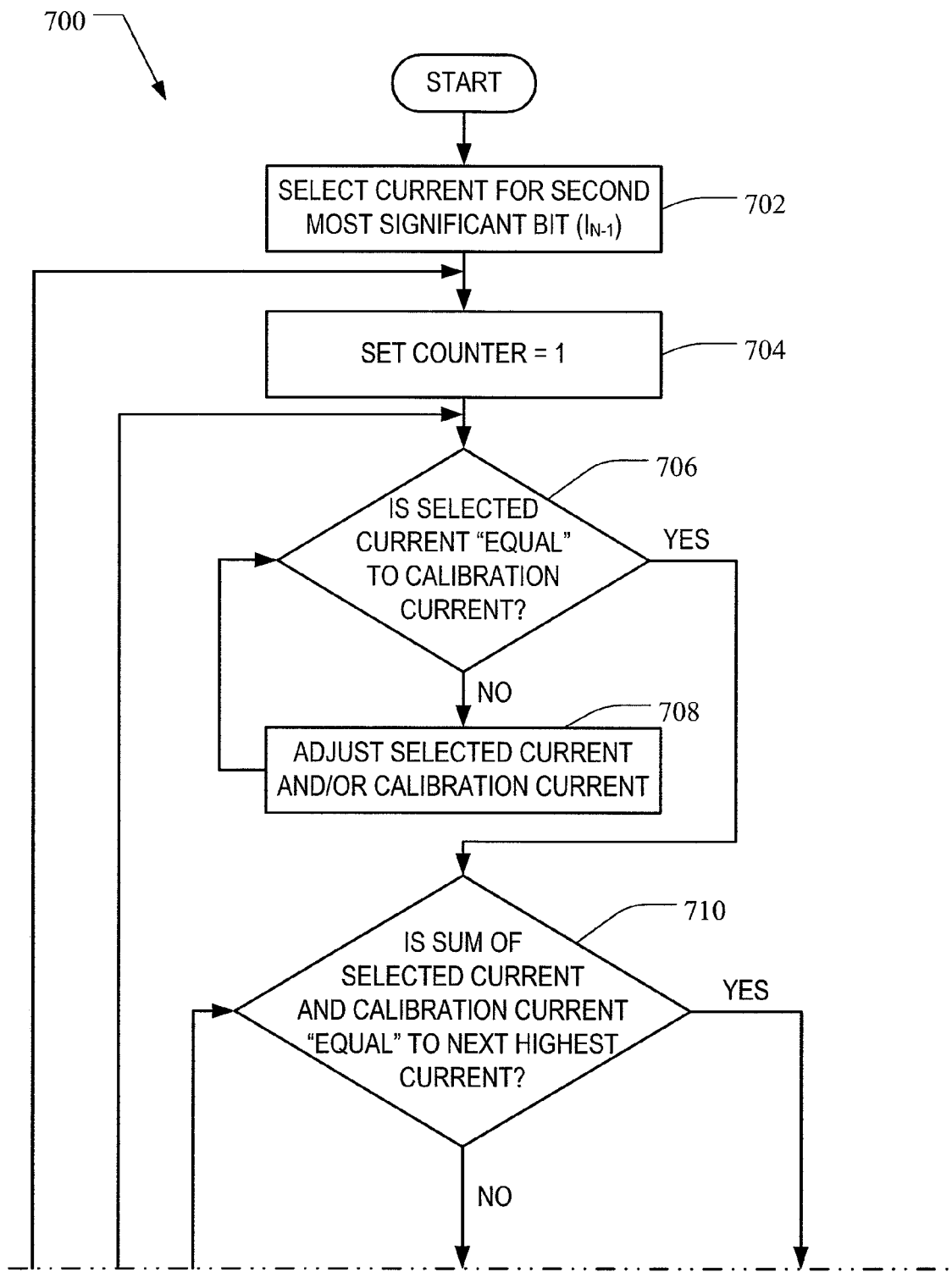
FIGS. 7A-B are a flow chart for operation of the circuit diagram depicted in FIG. 1.
Figure 7B:
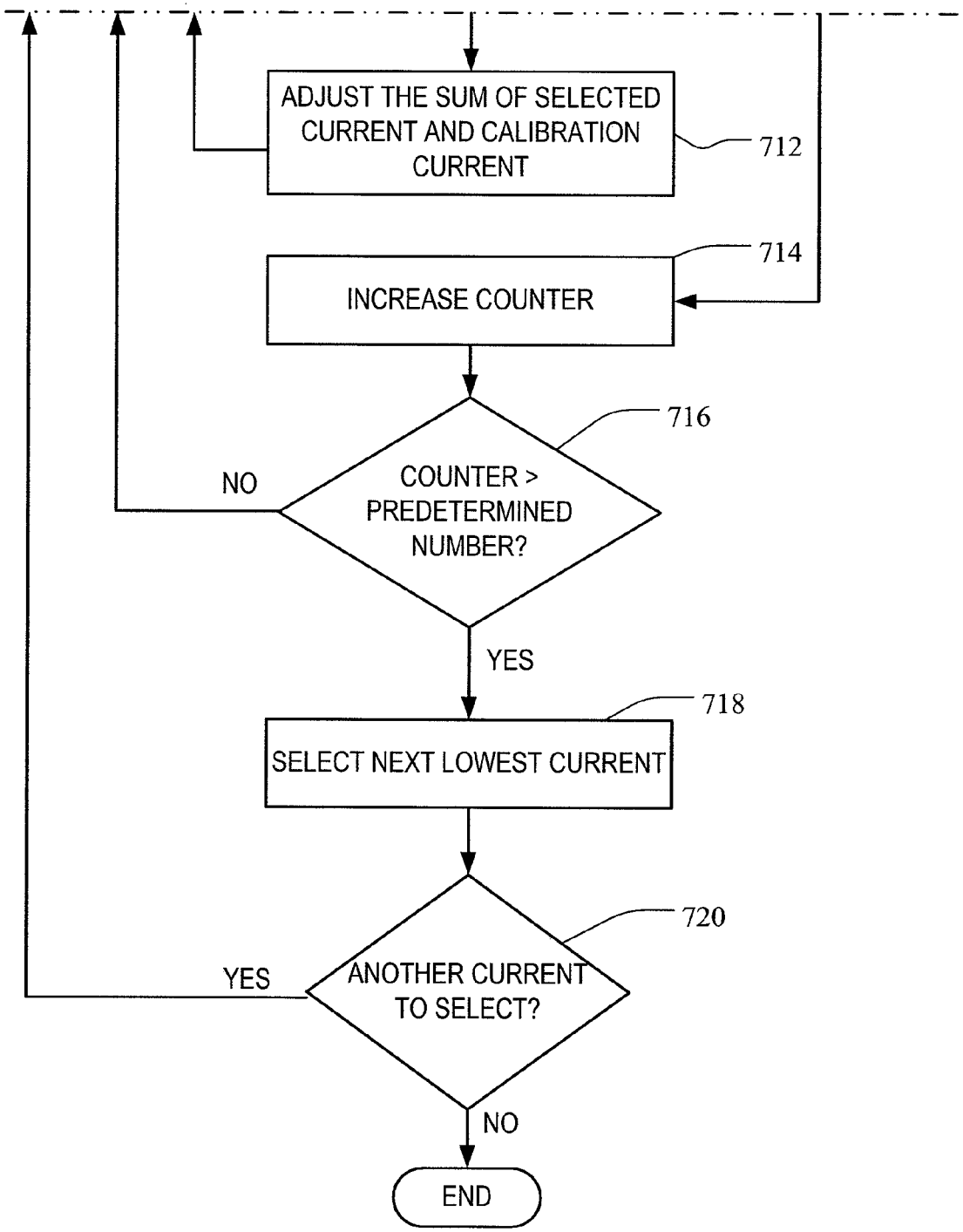

FIGS. 7A-B are a flow chart 700 for operation of the digital-to-analog converter 100 in FIG. 1. The digital-to-analog converter 100 may include multiple bits from bit 0 to bit N. The current for the second most significant bit ($I_{N-1}$) is selected, as shown at block 702. The flow chart 700 may iterate through the first and second calibration multiple times for a selected current. The number of times through the loop may be determined by a counter, with the counter being initially set to 1, as shown at block 704. Alternatively, the flow chart 700 may perform the first and second calibration a single time for the selected current, obviating the need for a counter.

The first calibration determines whether the selected current is equal, or substantially equal, to the calibration current, as shown at block 706. If not, the selected current and/or the calibration current may be adjusted, as shown at block 708. As discussed above, $V_{CAL,1}$ may be used to adjust both the selected current and the calibration current. If the selected current is equal to the calibration current, the second calibration determines whether the sum of the selected current and the calibration current is equal, or substantially equal, to the next highest current (i.e., the current for the next higher significant bit). If not, the sum of the selected current and the calibration current is adjusted, as shown at block 712. If so, the counter is increased, as shown at block 714 and it is determined whether the counter is greater than a predetermined number (the predetermined number determining the number of times to iterate), as shown at block 716. After iterating the predetermined number of times, the next lowest current (i.e., the current for the next lower significant bit) is selected, as shown at block 718. And, this is repeated until there is no other current to select, as shown at block 720.

Figure 8:
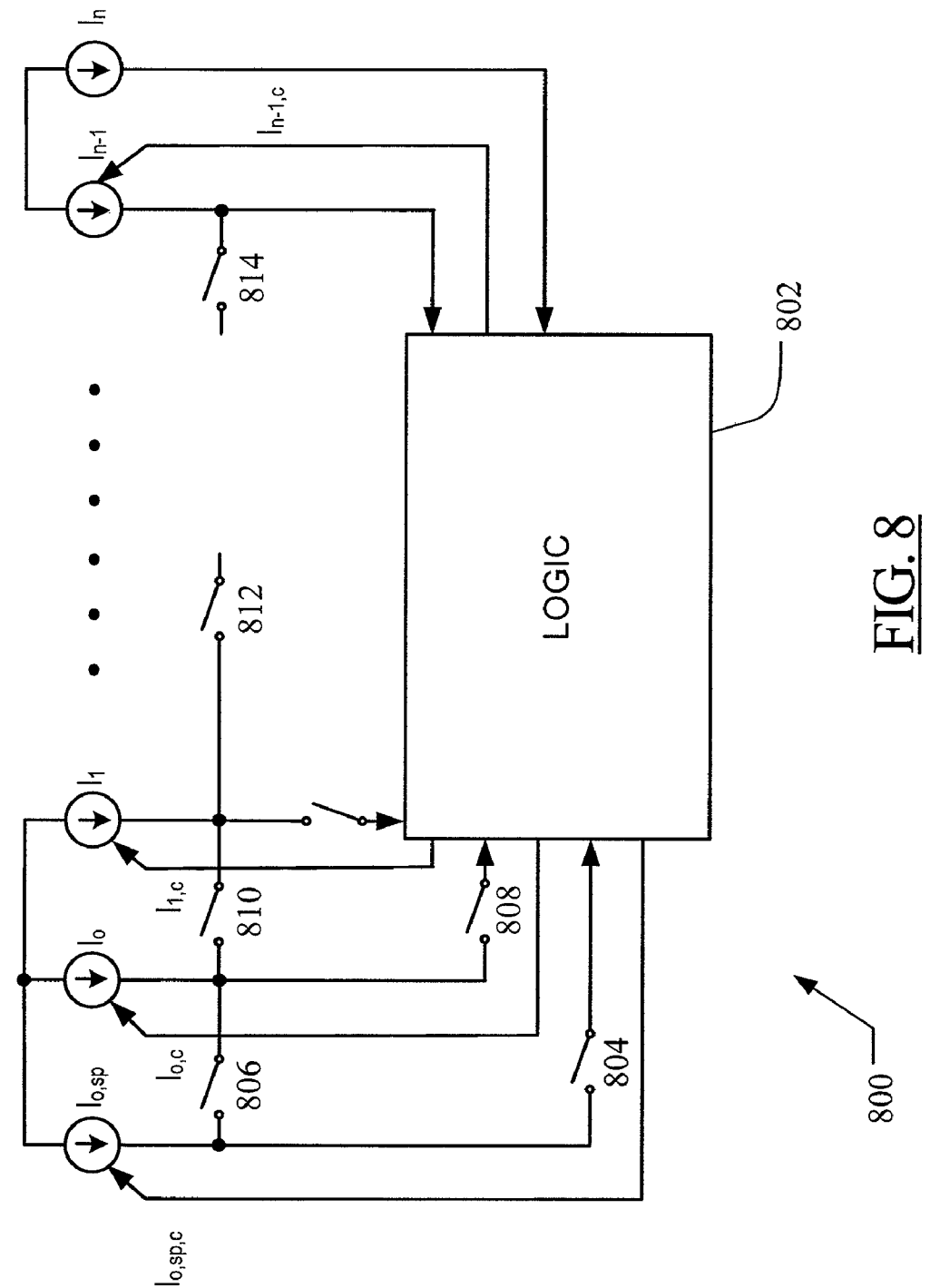
FIG. 8 is a schematic of another example of a digital-to-analog converter.

FIG. 8 shows another example of a digital-to-analog converter 800. Similar to the digital-to-analog converter 100, the digital-to-analog converter 800 includes a plurality of weighted current sources, depicted as $I_0, I_1, \ldots I_{n-1}$, and $I_n$. The digital-to-analog converter 800 further includes only one reference current source $I_{0,SP}$ with an input control signal $I_{0,SP,C}$ (as opposed to the n reference currents ($I_{0,SP}$ to $I_{n-1,SP}$) depicted in FIG. 1). In addition, the digital-to-analog converter 800 may include switches 804, 806, 808, 810, 812, and 814. Control of the switches 804, 806, 808, 810, 812, and 814 may enable comparison of the reference current source $I_{0,SP}$ with the weighted current source $I_0$, comparison of the sum of the reference current source $I_{0,SP}$ of the weighted current source $I_0$ with weighted current source $I_1$, etc.

The digital-to-analog converter 800 further includes logic 802 for calibrating one, some, or all of the weighted current sources $I_0, I_1, \ldots I_{n-1}$, and $I_n$ and the reference current source $I_{0,SP}$.

As shown in FIG. 8, the weighted current sources $I_0, I_1, \ldots I_{n-1}$ and the reference current source $I_{0,SP}$ are calibrated using control signals $I_{0,C}, I_{1,C}, \ldots, I_{n-1,C}$, and $I_{0,SP,C}$ generated by the logic 802. The logic 802 may receive as input the current from one, some, or all of the weighted current sources $I_0, I_1, \ldots I_{n-1}$, and $I_n$ and the reference current source $I_{0,SP}$ or combinations thereof. As shown in FIG. 8, the logic 802 receives input from all of the weighted current sources $I_0, I_1, \ldots I_{n-1}$, and $I_n$ and the reference current source $I_{0,SP}$.

Figure 9:
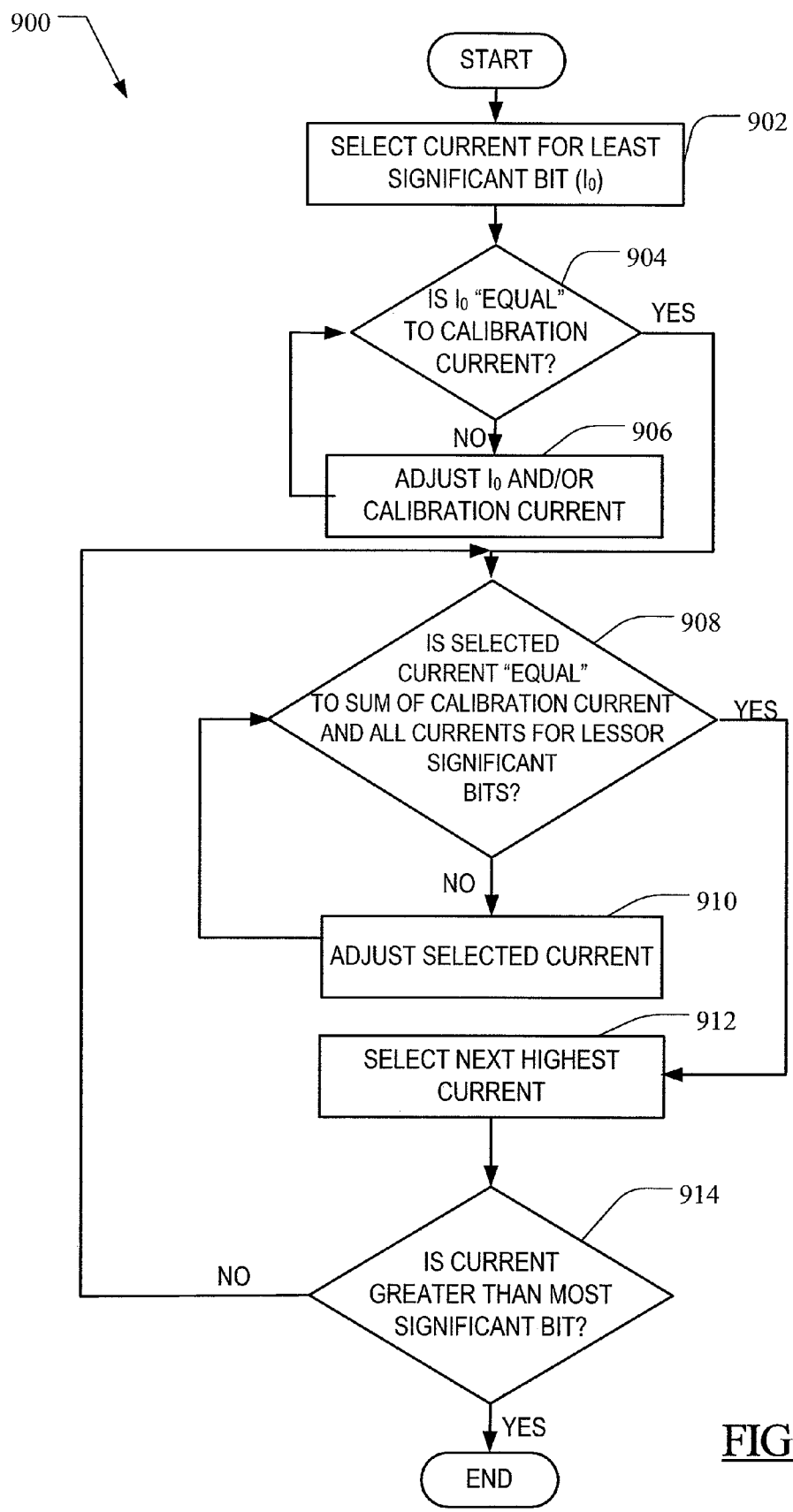
FIG. 9 is a flow chart for operation of the circuit diagram depicted in FIG. 8.

FIG. 9 is a flow chart 900 for operation of the digital-to-analog converter 800 in FIG. 8. The current source for the least significant bit ($I_0$) is selected, as shown at block 902. The current source for the least significant bit ($I_0$) may be calibrated by comparison with the calibration current from the reference current source $I_{0,SP}$. For example, calibration may include determining whether the current source for the least significant bit ($I_0$) is equal or substantially equal to the calibration current from the reference current source $I_{0,SP}$, as shown at block 904. If the current source for the least significant bit ($I_0$) is not equal or substantially equal to the calibration current from the reference current source $I_{0,SP}$, one or both of the current sources for the least significant bit ($I_0$) and the calibration current from the reference current source $I_{0,SP}$ may be adjusted, as shown at block 906. For example, a signal, such as $V_{CAL,1}$ may be used to adjust the current source for the least significant bit ($I_0$) and the calibration current from the reference current source $I_{0,SP}$.

The next highest current ($I_1$) may be selected and a loop may be entered. Then, it is determined whether the selected current source equals or substantially equals the sum of the calibration current and all current sources for lessor significant bits, as shown at block 908. In the first pass through the loop (with $I_1$ selected), the sum of the calibration current and all current sources for lessor significant bits is $I_{0,SP}+I_0$. On the second pass through the loop (with $I_2$ selected), the sum of the calibration current and all current sources for lessor significant bits is $I_{0,SP}+I_0+I_1$. If the selected current source does not equal or substantially equal the sum of the calibration current and all current sources for lessor significant bits, the selected current source is adjusted, as shown at block 910. The adjustment may comprise modifying the input control signal to the selected current source. If the selected current source equals or substantially equals the sum of the calibration current and all current sources for lessor significant bits, the next highest current source is selected, as shown at block 912. And, the loop iterates until the current source selected is greater than the most significant bit, as shown at block 914.

It is contemplated that the digital-to-analog converter described above may be implemented in any of a number of electronic devices to convert a digital signal into an analog signal. Such a digital-to-analog converter may be produced as an integrated circuit package that may be used for a number of different devices, and that may provide for implementation in devices which generate an analog output.

Figure 10B:
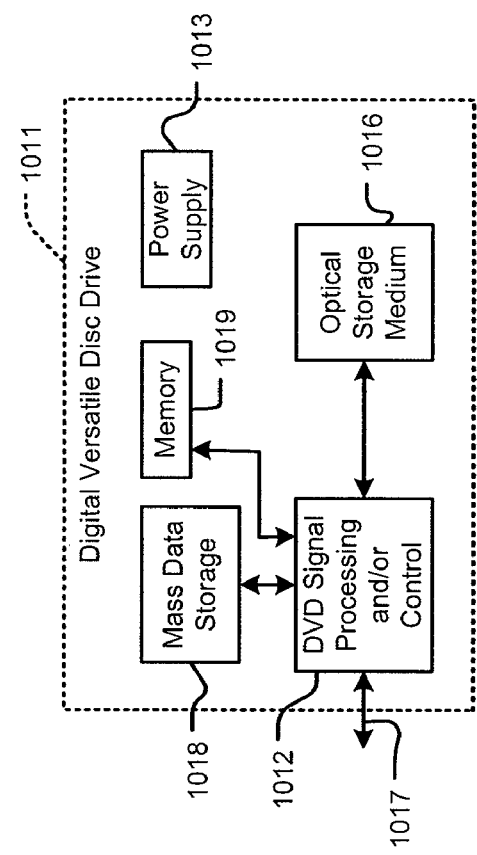
FIG. 10B is a functional block diagram of a digital versatile disk (DVD)
Figure 10A:
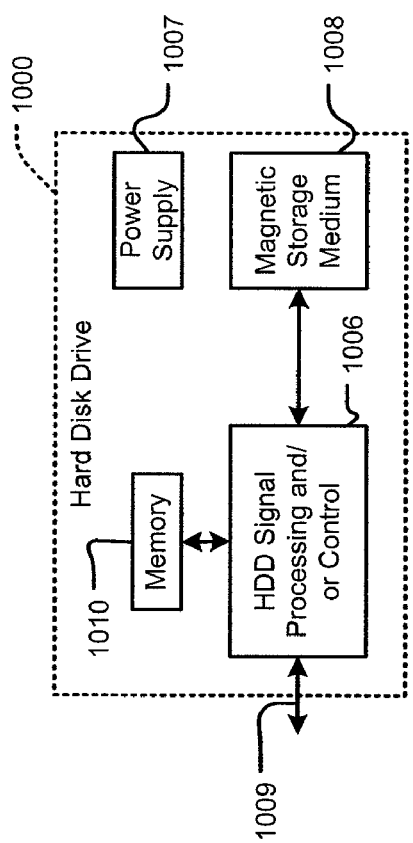
FIG. 10A is a functional block diagram of a hard disk drive.

Referring now to FIGS. 10A-10G, various exemplary implementations of the present invention are shown. Referring now to FIG. 10A, the present invention can be implemented in a hard disk drive 1000. For example, the digital-to-analog converter of the present invention may be implemented in the HDD signal processing and/or control circuits, which are generally identified in FIG. 10A at 1006. In some implementations, the signal processing and/or control circuit 1006 and/or other circuits (not shown) in the HDD 1000 may process data, perform coding and/or encryption, perform calculations, and/or format data that is output to and/or received from a magnetic storage medium 1008.

The HDD 1000 may communicate with a host device (not shown) such as a computer, mobile computing devices such as personal digital assistants, cellular phones, media or MP3 players and the like, and/or other devices via one or more wired or wireless communication links 1009. The HDD 1000 may be connected to memory 1010 such as random access memory (RAM), nonvolatile memory such as flash memory, read only memory (ROM), and/or other suitable electronic data storage. The HDD 1000 may further include a power supply 1007.

Referring now to FIG. 10B, the present invention can be implemented in a digital versatile disc (DVD) drive 1011. For example, the digital-to-analog converter of the present invention may be implemented in the signal processing and/or control circuits, which are generally identified in FIG. 10B at 1012. The signal processing and/or control circuit 1012 and/ or other circuits (not shown) in the DVD 1011 may process data, perform coding and/or encryption, perform calculations, and/or format data that is read from and/or data written to an optical storage medium 1016. In some implementations, the signal processing and/or control circuit 1012 and/or other circuits (not shown) in the DVD drive 1011 can also perform other functions such as encoding and/or decoding and/or any other signal processing functions associated with a DVD drive.

The DVD drive 1011 may communicate with an output device (not shown) such as a computer, television or other device via one or more wired or wireless communication links 1017. The DVD 1011 may communicate with mass data storage 1018 that stores data in a nonvolatile manner. The mass data storage 1018 may include a hard disk drive (HDD). The HDD may have the configuration shown in FIG. 1A. The HDD may be a mini HDD that includes one or more platters having a diameter that is smaller than approximately 1.8" The DVD drive 1011 may be connected to memory 1019 such as RAM or ROM, nonvolatile memory such as flash memory and/or other suitable electronic data storage. The DVD drive 1011 may further include a power supply 1013.

Figures 10C, 10D:
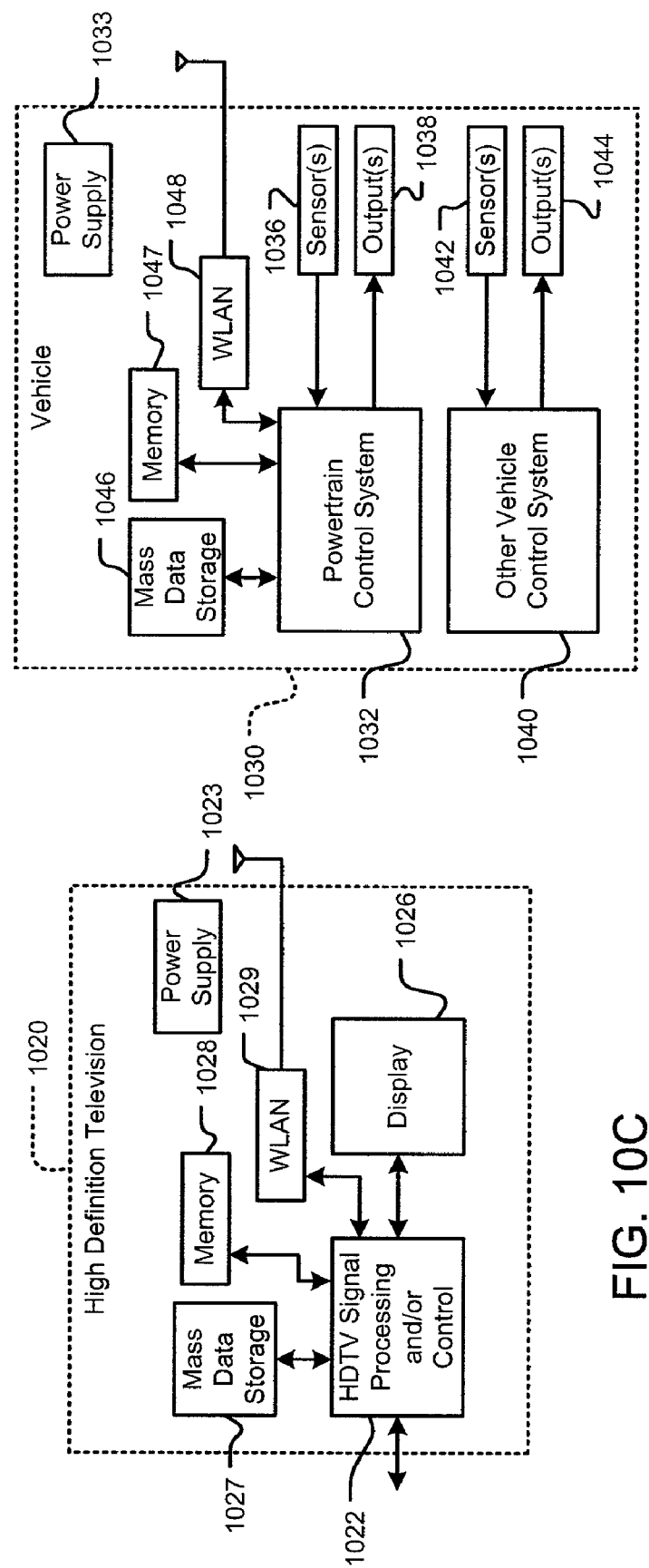
FIG. 10C is a functional block diagram of a high definition television.
FIG. 10D is a functional block diagram of a vehicle control system.

Referring now to FIG. 10C, the present invention can be implemented in a high definition television (HDTV) 1020. The digital-to-analog converter of the present invention may be implemented in the signal processing and/or control circuits, which are generally identified in FIG. 10E at 1022. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data, and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 10A, and/or at least one DVD drive may have the configuration shown in FIG. 10B. The HDD may be a mini HDD that includes one or more platters having a diameter that is smaller than approximately 1.8". The HDTV 1020 may be connected to memory 1028 such as RAM, ROM, nonvolatile memory such as flash memory, and/or other suitable electronic data storage. The HDTV 1020 also may support connections with a WLAN via a WLAN network interface 1029. The HDTV 1020 may further include a power supply 1023.

Referring now to FIG. 10D, the digital-to-analog converter of the present invention may be implemented in a control system of a vehicle 1030. In some implementations, the present invention may be implemented in a powertrain control system 1032 that receives input from one or more sensors such as temperature sensors, pressure sensors, rotational sensors, airflow sensors, and/or any other suitable sensors that generate one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with a mass data storage 1046 that stores data in a nonvolatile manner. The mass data storage 1046 may include optical and/or magnetic storage devices for example hard disk drives (HDDs) and/or DVDs. At least one HDD may have the configuration shown in FIG. 1A, and/or at least one DVD may have the configuration shown in FIG. 10B. The HDD may be a mini HDD that includes one or more platters having a diameter that is smaller than approximately 1.8". The powertrain control system 1032 may be connected to a memory 1047 such as RAM, ROM, nonvolatile memory such as flash memory, and/or other suitable electronic data storage. The powertrain control system 1032 also may support connections with a WLAN via a WLAN network interface 1048. The control system 1040 may also include mass data storage, memory and/or a WLAN interface (all not shown). The vehicle 1030 may further include a power supply 1033.

Figure 10E:
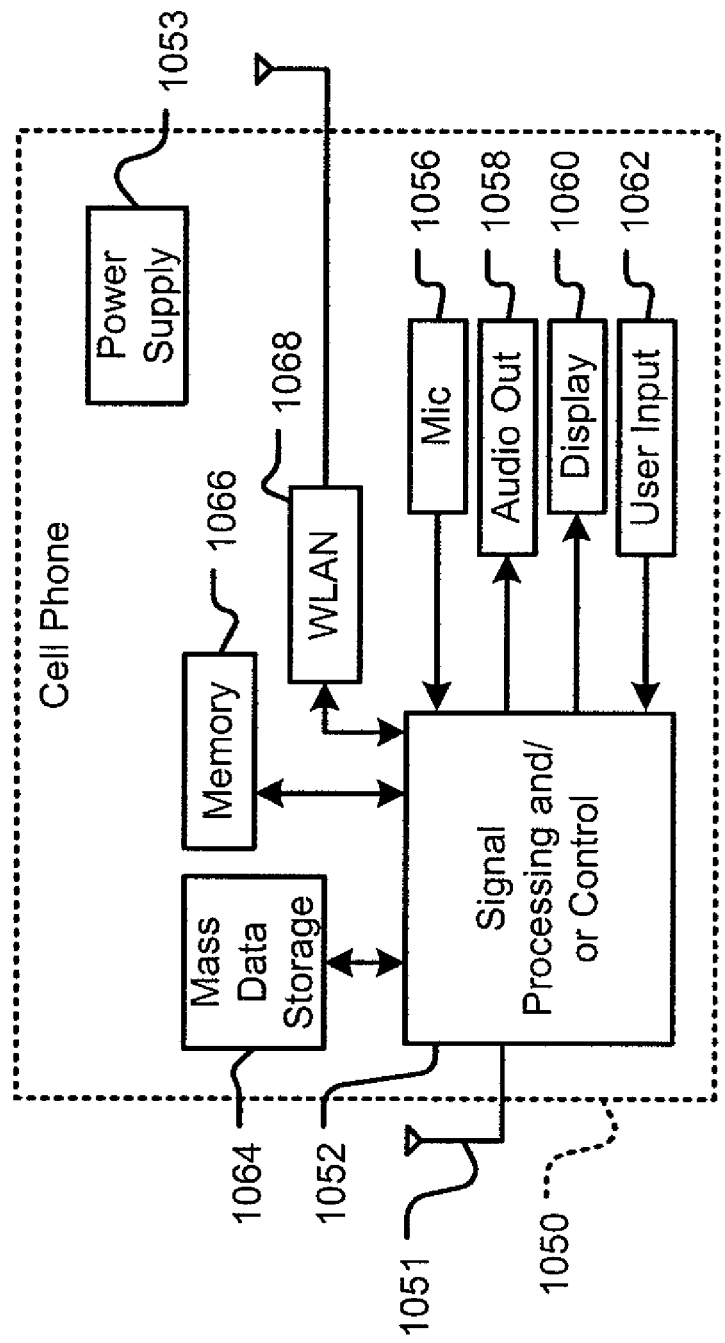
FIG. 10E is a functional block diagram of a cellular phone.

Referring now to FIG. 10E, the present invention can be implemented in a cellular phone 1050 that may include a cellular antenna 1051. For example, the digital-to-analog converter of the present invention may be implemented in either or both signal processing and/or control circuits, which are generally identified in FIG. 10E at 1052. In some implementations, the cellular phone 1050 includes a microphone 1056, an audio output 1058 such as a speaker and/or audio output jack, a display 1060, and/or a user input 1062 such as a keypad, pointing device, voice actuation, and/or other input device. The signal processing and/or control circuits 1052 and/or other circuits (not shown) in the cellular phone 1050 may process data, perform coding and/or encryption, perform calculations, format data, and/or perform other cellular phone functions.

The cellular phone 1050 may communicate with a mass data storage 1064 that stores data in a nonvolatile manner such as optical and/or magnetic storage devices, for example hard disk drives (HDDs) and/or DVDs. At least one HDD may have the configuration shown in FIG. 1A, and/or at least one DVD may have the configuration shown in FIG. 10B. The HDD may be a mini HDD that includes one or more platters having a diameter that is smaller than approximately 1.8". The cellular phone 1050 may be connected to memory 1066 such as RAM, ROM, nonvolatile memory such as flash memory, and/or other suitable electronic data storage. The cellular phone 1050 also may support connections with a WLAN via a WLAN network interface 1068. The cellular phone 1050 may further include a power supply 1053.

Figure 10F:
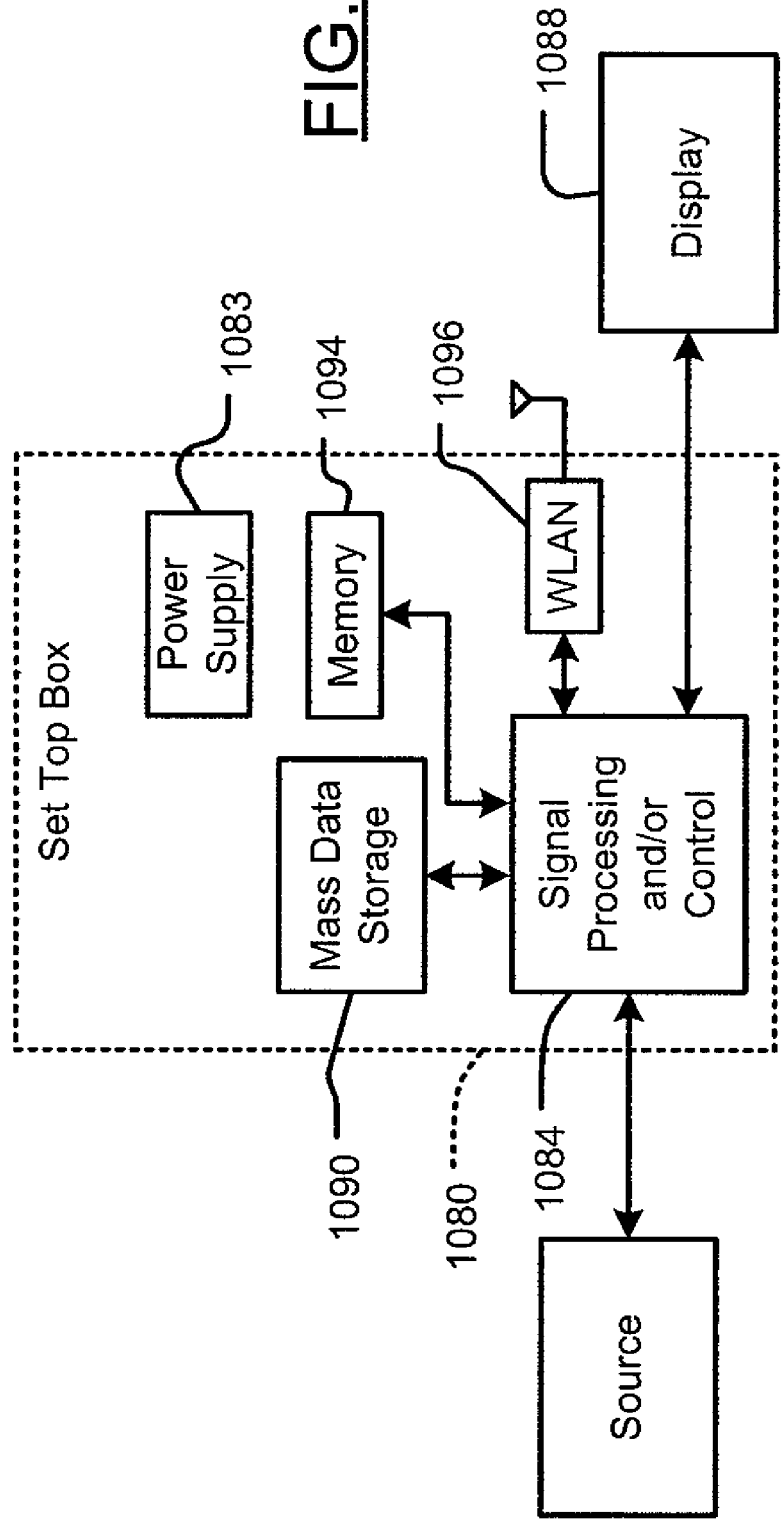
FIG. 10F is a functional block diagram of a set-top box.

Referring now to FIG. 10F, the present invention can be implemented in a set-top box 1080. For example, the digital-to-analog converter in the present invention may be implemented in either or both signal processing and/or control circuits, which are generally identified in FIG. 10F at 1084. The set-top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set-top box 1080 may process data, perform coding and/or encryption, perform calculations, format data and/or perform any other set-top box function.

The set-top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 10A and/or at least one DVD may have the configuration shown in FIG. 10B.

The HDD may be a mini HDD that includes one or more platters having a diameter that is smaller than approximately 1.8". The set-top box 1080 may be connected to memory 1094 such as RAM, ROM, nonvolatile memory such as flash memory, and/or other suitable electronic data storage. The set-top box 1080 also may support connections with a WLAN via a WLAN network interface 1096. The set-top box 1080 may further include a power supply 1083.

Figure 10G:
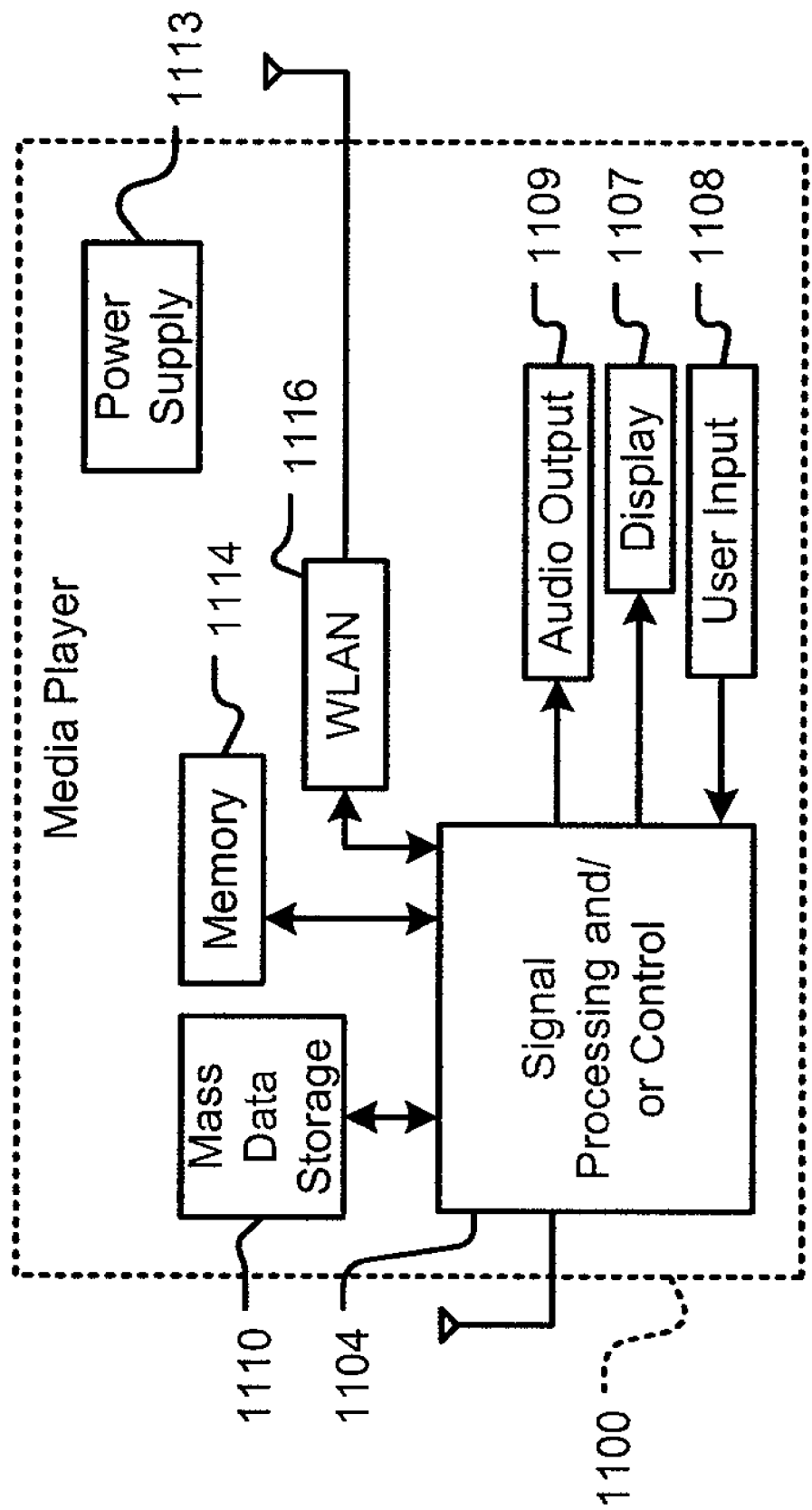
FIG. 10G is a functional block diagram of a media player.

Referring now to FIG. 10G, the present invention can be implemented in a media player 1100. For example, the digital-to-analog converter of the present invention may be implemented in either or both signal processing and/or control circuits, which are generally identified in FIG. 10G at 1104. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons, and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data, and/or perform any other media player function.

The media player 1100 may communicate with a mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example hard disk drives (HDDs) and/or DVDs. At least one HDD may have the configuration shown in FIG. 1A, and/or at least one DVD may have the configuration shown in FIG. 10B. The HDD may be a mini HDD that includes one or more platters having a diameter that is smaller than approximately 1.8". The media player 1100 may be connected to a memory 1114 such as RAM, ROM, nonvolatile memory such as flash memory, and/or other suitable electronic data storage. The media player 1100 also may support connections with a WLAN via a WLAN network interface 1116. The media player 1100 may further include a power supply 1113. Still other implementations in addition to those described above are contemplated.

It is intended that the foregoing detailed description be understood as an illustration of selected forms that the invention can take, and not as a definition of the invention. It is only the following claims, including all equivalents, that are intended to define the scope of this invention.

What is claimed is:

1. A digital-to-analog converter for converting an m-bit digital input into an analog output, the digital-to-analog converter comprising:
   a plurality of current sources for generating m weighted currents;
   at least one reference current source for generating a reference current;
   first logic for calibrating a first of the m weighted currents by comparing the first of the m weighted currents with the reference current; and
   second logic for calibrating a second of the m weighted currents by comparing the first of the m weighted currents with the second of the m weighted currents.

2. The digital-to-analog converter of claim 1, wherein the first logic for calibrating the first of the m weighted currents comprises logic for modifying the first of the m weighted currents to be substantially equal to the reference current.

3. The digital-to-analog converter of claim 2, wherein the first logic for calibrating the first of the m weighted currents comprises logic for modifying the reference current.

4. The digital-to-analog converter of claim 2, wherein the second logic for calibrating the second of the m weighted currents comprises, after making the first of the m weighted current substantially equal to the reference current, logic for:
   comparing a sum of the first of the m weighted currents and the reference current with the second of the m weighted currents; and
   modifying the second of the m weighted currents in order to make the sum and the second of the m weighted currents substantially equal.

5. The digital-to-analog converter of claim 4, wherein the at least one reference current source comprises multiple reference current sources, each of the multiple reference current sources generating current that is different from currents generated by other reference current sources.

6. The digital-to-analog converter of claim 5, wherein the multiple reference current sources consist of m−1 reference current sources.

7. The digital-to-analog converter of claim 6, wherein the m weighted currents comprise a most significant bit weighted current and a second most significant bit weighted current; and
wherein the calibrating is iteratively performed,
in a first iteration, the first of the m weighted currents comprising the second most significant bit weighted current and the second of the m weighted currents comprising the most significant bit weighted current; and
in subsequent iterations, the first of the m weighted currents and the second of the weighted currents being reduced by one significant bit from a previous iteration.

8. The digital-to-analog converter of claim 4, wherein a single reference current source is used to calibrate a plurality of the m weighted currents.

9. The digital-to-analog converter of claim 8, wherein the first of the m weighted currents comprises a weighted current for a least significant bit;
wherein the second of the m weighted currents comprises a weighted current for a second least significant bit; and
wherein the logic for modifying the second of the m weighted currents comprises logic for modifying the weighted current for the second least significant bit to make it substantially equal to the sum.

10. The digital-to-analog converter of claim 9, wherein a current for calibration comprises a weighted current for a third least significant bit;
the digital-to-analog converter further comprising logic for iteratively performing:
comparing the current for calibration with a sum of the reference current and each of the weighted currents that are for less significant bits than the current for calibration;
calibrating the current for calibration based on the comparing of the current for calibration with the sum; and
resetting the current for calibration as a current for a next higher significant bit than the current for calibration.

11. The digital-to-analog converter of claim 1, wherein the m weighted currents comprise m binary weighted currents.

12. The digital-to-analog converter of claim 1, wherein the first logic for calibrating a first of the m weighted currents comprises logic for serially sensing current in the first of the m weighted currents.

13. The digital-to-analog converter of claim 1, wherein the first logic for calibrating a first of the m weighted currents comprises logic for sensing current in the first of the m weighted currents in parallel.

14. A multi-function printer incorporating the digital-to-analog converter of claim 1.

15. A hard disk drive incorporating the digital-to-analog converter of claim 1.

16. A digital versatile disk drive incorporating the digital-to-analog converter of claim 1.

17. A high definition television incorporating the digital-to-analog converter of claim 1.

18. A vehicle control system incorporating the digital-to-analog converter of claim 1.

19. A cellular phone incorporating the digital-to-analog converter of claim 1.

20. A set-top box incorporating the digital-to-analog converter of claim 1.

21. A media player incorporating the digital-to-analog converter of claim 1.

22. The digital-to-analog converter of claim 2, wherein the second logic for calibrating the first of the m weighted currents comprises, after making the first of the m weighted current substantially equal to the reference current, logic for:
comparing a sum of the first of the m weighted currents and the reference current with the second of the m weighted currents; and
modifying the sum of the first of the m weighted currents and the reference current in order to make the sum and the second of the m weighted currents substantially equal.

23. A method of calibrating a digital-to-analog converter that converts an m-bit digital input into an analog output using m weighted currents, the method comprising:
comparing a first of the m weighted currents with a reference current;
first calibrating of the first of the m weighted currents by adjusting the first of the m weighted currents based on the comparing of the first of the m weighted currents with the reference current;
comparing the first of the m weighted currents with a second of the m weighted currents; and
second calibrating of the second of the m weighted currents by adjusting the second of the m weighted currents based on the comparing of the first of the m weighted currents with the second of the m weighted currents.

24. The method of claim 23, wherein first calibrating the first of the m weighted currents comprises modifying the first of the m weighted currents to be substantially equal to the reference current.

25. The method of claim 24, wherein first calibrating the first of the m weighted currents comprises modifying the reference current.

26. The method of claim 24, wherein second calibrating the second of the m weighted currents comprises, after making the first of the m weighted current substantially equal to the reference current:
comparing a sum of the first of the m weighted currents and the reference current with the second of the m weighted currents; and
modifying the second of the m weighted currents to make the sum and the second of the m weighted currents substantially equal.

27. The method of claim 26, wherein calibrating the first of the m weighted currents and calibrating the second of the m weighted currents are iteratively performed,
in a first iteration with the first of the m weighted currents comprising a weighted current for a second most significant bit and the second of the m weighted currents comprising a weighted current for a most significant bit; and
in subsequent iterations with the first of the m weighted currents and the second of the weighted currents being reduced by one significant bit from a previous iteration.

28. The method of claim 26, wherein a single reference current source is used to calibrate a plurality of the m weighted currents.

29. The method of claim 28, wherein the first of the m weighted currents comprises a weighted current for a least significant bit;
wherein the second of the m weighted currents comprises a weighted current for a second least significant bit; and
wherein modifying the second of the m weighted currents comprises modifying the second of the m weighted currents to be substantially equal to the sum.

30. The method of claim 29, wherein a current for calibration comprises a weighted current for a third least significant bit;
further comprising iteratively performing:

comparing the current for calibration with a sum of the reference current and each of the weighted currents that are for less significant bits than the current for calibration;

calibrating the current for calibration based on the comparing of the current for calibration with the sum; and resetting the current for calibration as a current for a next higher significant bit than the current for calibration.

31. A digital-to-analog converter for converting an m-bit digital input into an analog output, the digital-to-analog converter comprising:

means for generating m weighted currents;

means for generating a reference current;

means for first calibrating a first of the m weighted currents by comparing the first of the m weighted currents with the reference current; and means for second calibrating a second of the m weighted currents by comparing the first of the m weighted currents with the second of the m weighted currents.

32. The digital-to-analog converter of claim 31, wherein the means for first calibrating the first of the m weighted currents modifies the first of the m weighted currents to be substantially equal to the reference current.

33. The digital-to-analog converter of claim 32, wherein the first means for calibrating the first of the m weighted currents modifies the reference current.

34. The digital-to-analog converter of claim 31, wherein the means for second calibrating the second of the m weighted currents comprises:

means for comparing a sum of the first of the m weighted currents and the reference current with the second of the m weighted currents; and means for modifying the second of the m weighted currents in order to make the sum and the second of the m weighted currents substantially equal.

35. The digital-to-analog converter of claim 34, wherein the at least one reference current source comprises multiple reference current sources, each of the multiple reference current sources generating current that is different from currents generated by other reference current sources.

36. The digital-to-analog converter of claim 35, wherein the multiple reference current sources consist of m−1 reference current sources.

37. The digital-to-analog converter of claim 36, wherein the calibrating is iteratively performed, in a first iteration with the first of the m weighted currents comprising a weighted current for a second most significant bit and the second of the m weighted currents comprising a weighted current for a most significant bit; and in subsequent iterations with the first of the m weighted currents and the second of the weighted currents being reduced by one significant bit from a previous iteration.

38. The digital-to-analog converter of claim 34, wherein a single reference current source is used to calibrate a plurality of the m weighted currents.

39. The digital-to-analog converter of claim 38, wherein the first of the m weighted currents comprises a weighted current for a least significant bit;

wherein the second of the m weighted currents comprises a weighted current for a second least significant bit; and wherein the means for modifying the second of the m weighted currents modifies the weighted current for a second least significant bit to be substantially equal to the sum.

40. A digital-to-analog converter for converting an m-bit digital input into an analog output, the digital-to-analog converter comprising:

a plurality of current sources for generating m weighted currents;

at least one reference current source for generating a reference current;

first logic for calibrating a first of the m weighted currents by comparing the first of the m weighted currents with the reference current; and second logic for calibrating the first of the m weighted currents by comparing the first of the m weighted currents with the second of the m weighted currents.

41. The digital-to-analog converter of claim 40, wherein the first logic for calibrating the first of the m weighted currents comprises logic for modifying the first of the m weighted currents to be substantially equal to the reference current.

* * * * *